(12) United States Patent
Kengeri et al.

(10) Patent No.: US 7,251,186 B1
(45) Date of Patent: Jul. 31, 2007

(54) MULTI-PORT MEMORY UTILIZING AN ARRAY OF SINGLE-PORT MEMORY CELLS

(75) Inventors: Subramani Kengeri, San Jose, CA (US); Deepak Sabharwal, New Delhi (IN); Prakash Bhatia, Fremont, CA (US); Shreekanth Sampigethaya, San Jose, CA (US); Sanjiv Kainth, New Delhi (IN)

(73) Assignee: Virage Logic Corporation, Fremont, CA (US)

( * ) Notice: Subject to any disclaimer, the term of this patent is extended or adjusted under 35 U.S.C. 154(b) by 58 days.

(21) Appl. No.: 11/147,928

(22) Filed: Jun. 7, 2005

Related U.S. Application Data

(60) Provisional application No. 60/577,897, filed on Jun. 7, 2004.

(51) Int. Cl.
*G11C 7/00* (2006.01)
(52) U.S. Cl. .................................. 365/230.05; 365/233
(58) Field of Classification Search ........... 365/230.05, 365/233
See application file for complete search history.

(56) References Cited

U.S. PATENT DOCUMENTS

| | | | |
|---|---|---|---|
| 5,808,959 A | 9/1998 | Kengeri et al. | |
| 5,872,742 A | 2/1999 | Kengeri et al. | |
| 6,084,820 A | 7/2000 | Raszka | |
| 6,104,663 A | 8/2000 | Kablanian | |
| 6,108,250 A | 8/2000 | Kengeri | |
| 6,191,998 B1 | 2/2001 | Reddy et al. | |
| 6,259,634 B1 | 7/2001 | Kengeri et al. | |
| 6,259,648 B1 | 7/2001 | Kragick | |
| 6,442,098 B1 | 8/2002 | Kengeri | |
| 6,452,834 B1 | 9/2002 | Kengeri | |
| 6,459,647 B1 | 10/2002 | Kengeri | |
| 6,467,017 B1 | 10/2002 | Ngai et al. | |
| 6,738,279 B1 | 5/2004 | Kablanian | |
| 6,778,462 B1 | 8/2004 | Castagnetti et al. | |
| 6,809,983 B2 | 10/2004 | Jung | |
| 6,992,938 B1 * | 1/2006 | Shubat et al. ............... | 365/201 |
| 7,095,076 B1 * | 8/2006 | Han et al. ................... | 257/319 |
| 7,139,204 B1 | 11/2006 | Behera | |

* cited by examiner

*Primary Examiner*—Michael Tran
(74) *Attorney, Agent, or Firm*—Blakely Sokoloff Taylor & Zafman LLP

(57) ABSTRACT

A multi-port memory device with an array of single-port memory cells is disclosed. According to one embodiment of the invention, the multi-port memory device has N number of memory ports, and is capable of performing any combination of N number of read/write operations during a single cycle of an externally generated core clock signal, without the need of any other externally generated clocking signals.

18 Claims, 7 Drawing Sheets

MULTI-PORT MEMORY UTILIZING AN ARRAY OF SINGLE-PORT MEMORY CELLS

RELATED APPLICATIONS

The present application is related to and claims the benefit of the filing date of U.S. Provisional Patent Application with Ser. No. 60/577,897, filed on Jun. 7, 2004, which is hereby incorporated herein by reference.

TECHNICAL FIELD

The present invention relates generally to memory devices. More particularly, the present invention relates to a memory device with multiple ports utilizing an array of single-port memory cells.

BACKGROUND

A randomly accessible, single-port memory device is a memory device that allows access to one memory address per clock cycle. In contrast, a dual-port memory device allows two memory addresses to be simultaneously accessed (e.g., written to and/or read from) during a single clock cycle. For example, with a dual-port memory device having two ports (e.g., port A and port B), during a single clock cycle, data may be read from address A on port A while data is being written to address B on port B. Consequently, dual-port memory devices are often utilized in multiprocessor systems having two (or more) processors that require simultaneous access to data stored in a single memory array.

There are several techniques for implementing a dual-port random access memory device. One type of conventional dual-port memory device is based on an array of dual-port memory cells. That is, the individual memory cells are designed to allow simultaneous read/write access during a single clock cycle. FIG. 1 illustrates an example of a conventional true dual-port memory cell. As illustrated in FIG. 1, the dual-port memory cell 10 has two sets of complimentary bit-lines 12, 14, 16 and 18—one set for each port (e.g., port A and port B). In addition, each bit line is connected to a row-select transistor, or "pass" gate (e.g., transistors T5, T6, T7 and T8). Each row-select transistor is connected to a word-line 20 and 22 that is asserted during a read or write operation to facilitate the reading or writing of the memory cell. Compared to a single-port memory cell, a true dual-port memory cell 10 has twice the number of bit-lines, word-lines, and row-select transistors per individual memory cell. Consequently, compared to an array of single-port memory cells, an array of true dual-port memory cells occupies a significantly greater area of silicon per memory device and is therefore generally more costly to implement than an array based on single port memory cells.

As a result, a variety of dual-port memory devices that utilize single-port memory cells have been designed. One technique for implementing a dual-port memory device with an array of single-port memory cells is to partition the single-port memory array so that one address within each partition can be accessed simultaneously during a single clock cycle. Collision detection and correction logic is utilized to detect when both addresses are in the same partition. Generally, the greater the number of partitions, the less chance that both ports will attempt to access an address on the same partition during the same clock cycle. However, as more and more partitions are added, the complexity and size of the access control logic (e.g., the read/write logic) and collision detection logic increases. Furthermore, restricting access to addresses in different partitions during a single clock cycle is an undesirable limitation.

Another technique for emulating a dual-port memory device with an array of single-port memory cells is by utilizing a second clock signal to operate the memory device at twice the speed (e.g., frequency) of the system clock. For example, a second clock generating circuit, external to the memory device, may be used to generate a second clock signal, which operates at a frequency twice that of the system clock, or core clock. Accordingly, the processor and all other portions of the circuit are clocked at the frequency of the system or core clock, while the memory device is configured to operate at the frequency of the second clock (twice the frequency of the core clock).

FIG. 2 illustrates an example of a circuit 24 having a dual-port memory device 26 with an array of single-port memory cells 28, based on a dual clock signal design. For example, in the circuit 24 illustrated in FIG. 2, the dual-port memory device 26 operates in a clock domain 30 that is different from the core clock domain 32. Accordingly, the circuit 24 includes clock balancing and synchronization logic 34. The clock balancing and synchronization logic 34 receives a core clock signal, which cycles high and low at a particular frequency (e.g., 500 Megahertz), and generates a memory clock signal that cycles high and low at twice the frequency of the core clock signal. Accordingly, the multiplexing read and write logic 36 routes address and data signals to the single-port memory device 26 at a frequency (e.g., 500 Megahertz) that is half of that at which the single-port memory device operates (e.g., 1 Gigahertz). Consequently, the single-port memory device can simulate a dual-port memory device by operating based on a clock signal that has a frequency that is two times greater than the core clock signal.

There are several problems associated with this last approach. In particular, utilizing a second clock signal to operate the single-port memory device at twice the speed of the core clock presents a variety of clock timing, clock-domain, and performance degradation issues. First, as core clock frequencies continue to increase, so too does the level of difficulty in designing logic to synchronize a second clock with the core clock. For example, a system developer may have to spend a significant amount of development time designing and testing the clocking logic and synchronization logic that serves as the interface between the memory device and the system. In addition, the additional clock and synchronization logic occupy valuable space on the silicon of the chip, potentially increasing the size and cost of the system. Finally, the extra logic may introduce performance degradation into the system due to one or more delays during which read and write operations are allowed proper set-up and hold times for data. Consequently, there exists a need for an improved dual-port memory design.

SUMMARY OF THE DESCRIPTION

A method and system for implementing a multi-port memory device are described. According to one embodiment of the present invention, a multi-port memory device is comprised of read/write logic coupled to a plurality of single-port memory cells arranged in a two-dimensional array. As a single-port memory cell, each memory cell is connected to a single word-line and a pair of bit-lines. The read/write logic of the multi-port memory device includes multiple ports for receiving multiple addresses. Accordingly, for each port of the multi-port memory device, during a single clock cycle of a core clock, the memory device performs a read/write operation.

BRIEF DESCRIPTION OF THE DRAWINGS

The present invention is illustrated by way of example, and not by way of limitation, in the figures of the accompanying drawings, in which like references indicate similar elements, and in which.

DETAILED DESCRIPTION

A multi-port memory device having an array of single-port memory cells is described. In the following description, for purposes of explanation, numerous specific details are set forth in order to provide a thorough understanding of the present invention. It will be evident, however, to one skilled in the art that the present invention may be practiced without these specific details.

According to an embodiment of the present invention, a dual-port memory device having an array of single-port memory cells is capable of performing two memory access operations (e.g., read or write operations) in a single clock cycle of a core clock signal. Moreover, the memory device receives only the core clock signal, and no other externally generated clock signals. Accordingly, internal timing signals are generated via internal memory clock control logic. Consequently, system developers can use a core clock signal, which may be used to clock other logic components, as the sole clock input for the memory device. Importantly, using an embodiment of the present invention, system developers do not have to generate special or secondary, external clock or timing logic with the memory device.

Figure 1:
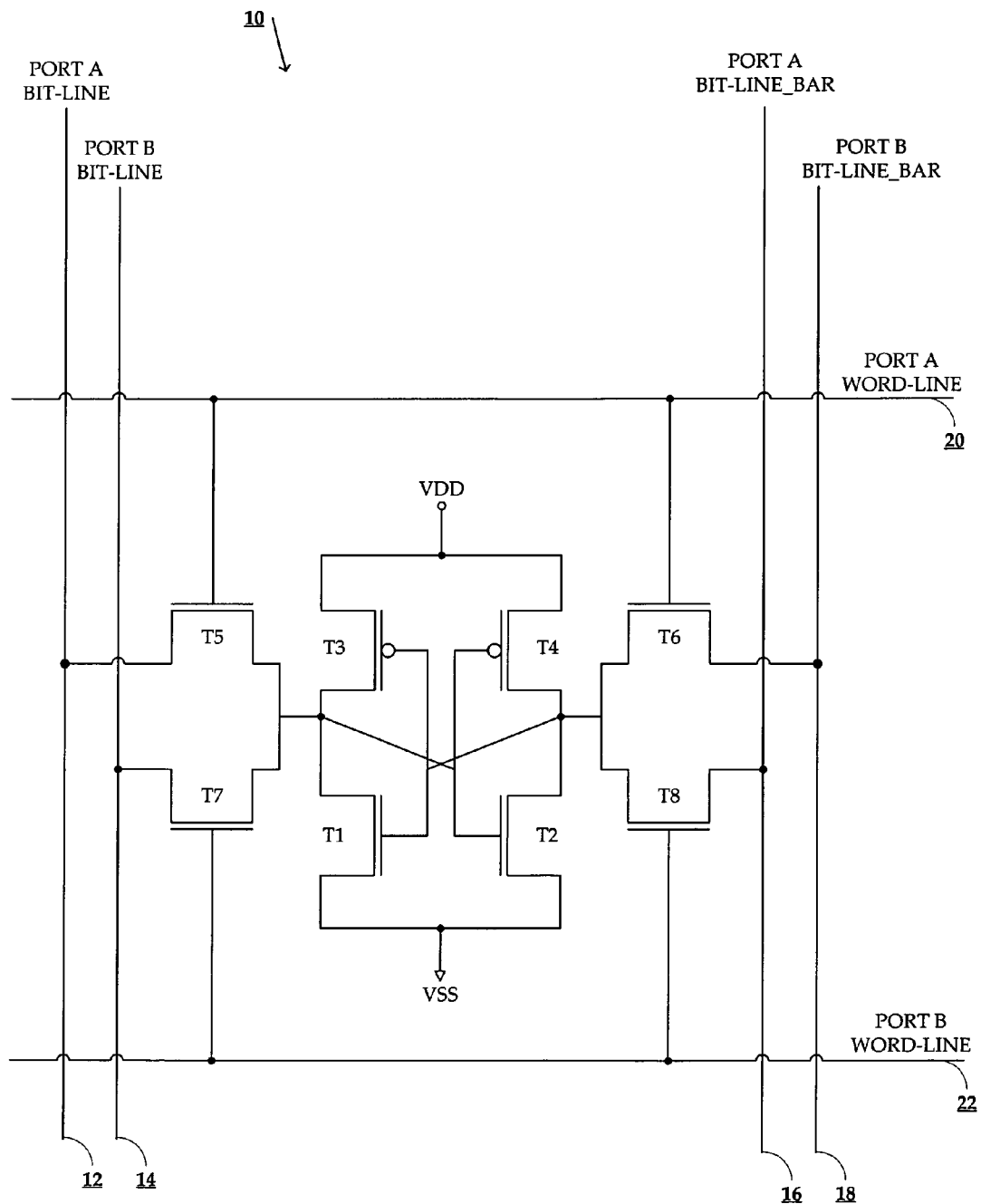
FIG. 1 illustrates an example of a conventional (prior art) dual-port memory cell.
Figure 2:
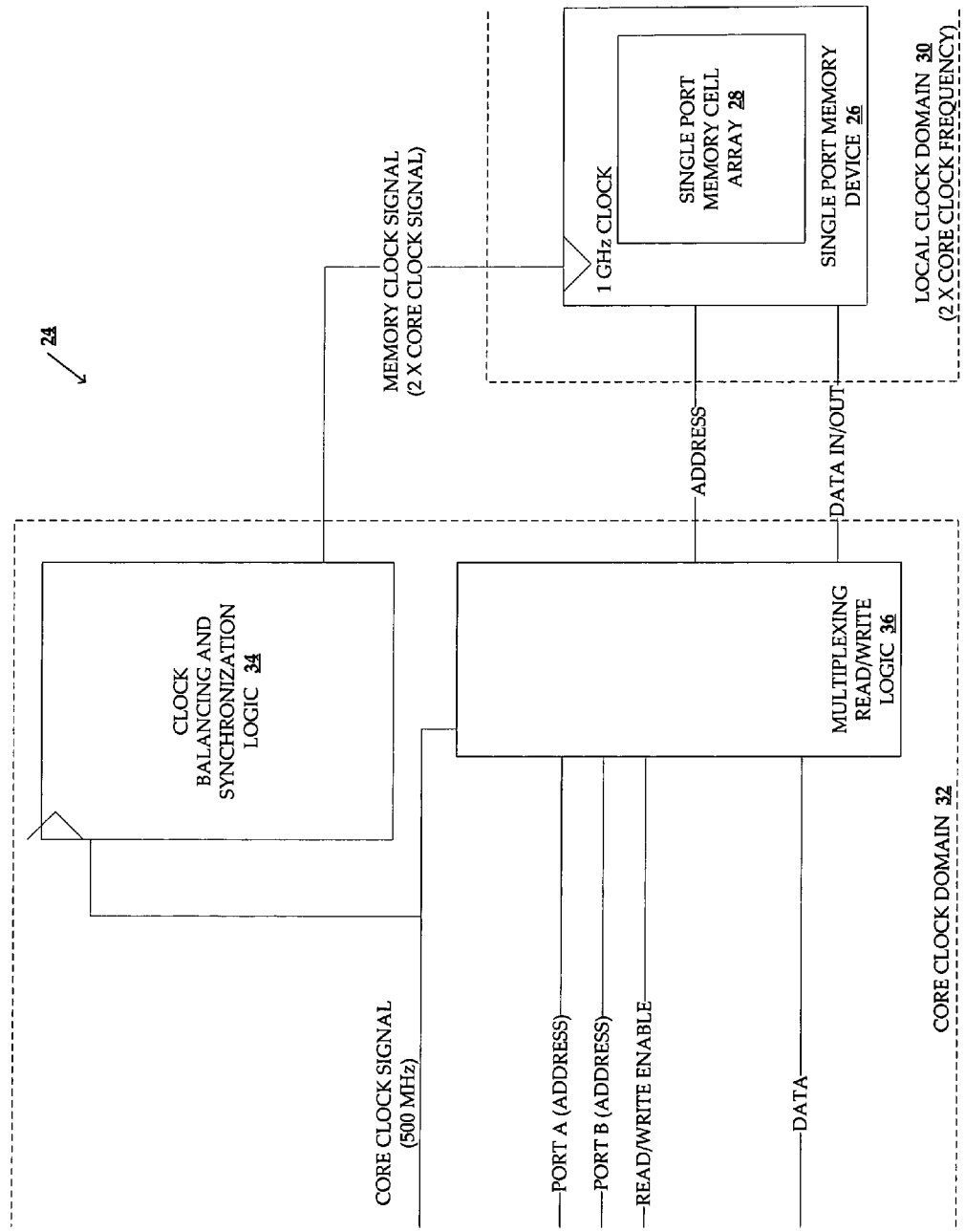
FIG. 2 illustrates an example of a conventional (prior art) circuit having a dual-port memory device with an array of single-port memory cells, based on a dual clock signal design.
Figure 3:
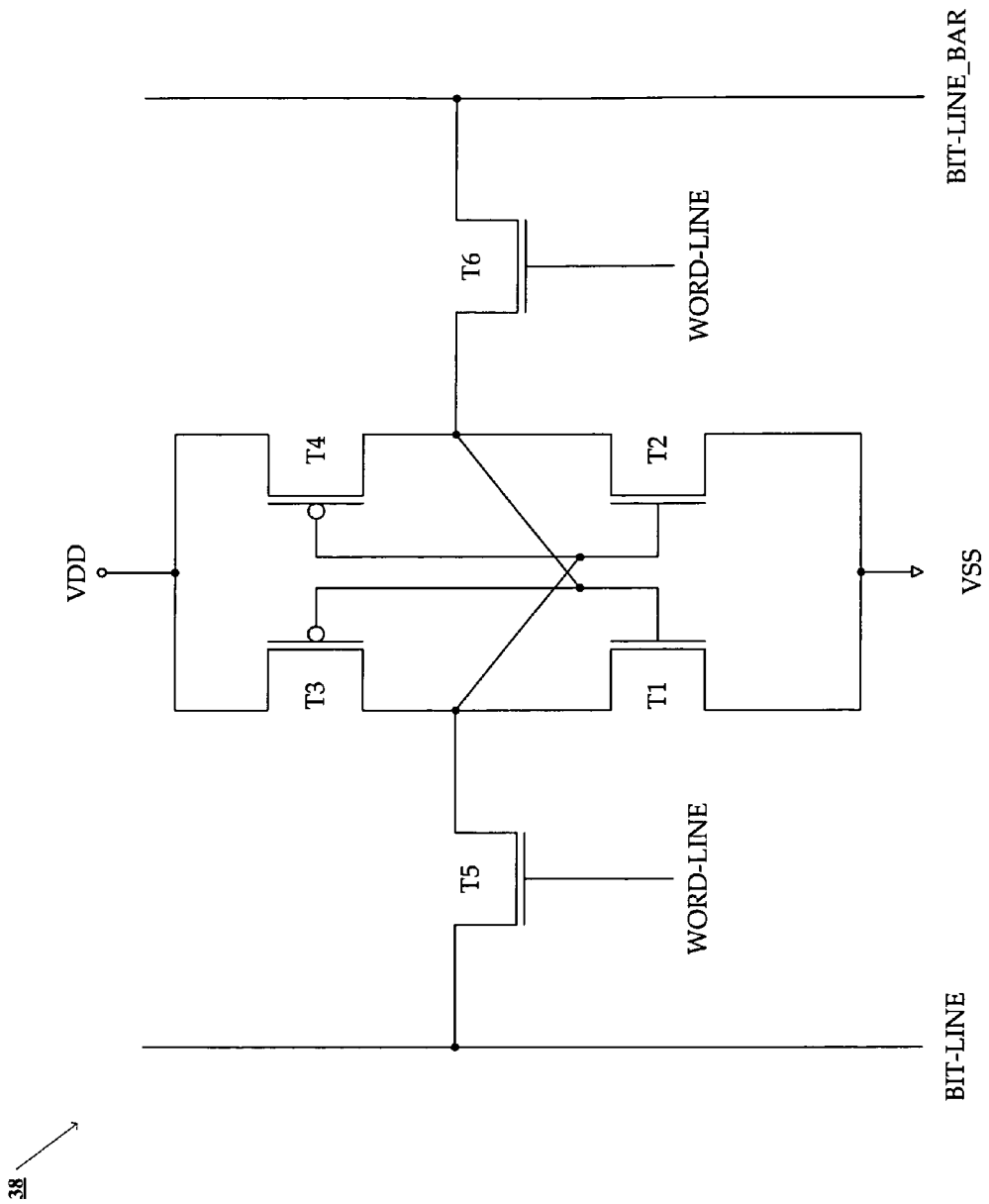
FIG. 3 illustrates a conventional, single-port memory cell 38 utilized in a two-dimensional, single-port memory cell array, according to one embodiment of the present invention.

FIG. 3 illustrates a conventional, single-port memory cell 38 utilized in a two-dimensional, single-port memory cell array, according to one embodiment of the present invention. The single-port memory cell shown in FIG. 3 is a six-transistor (6T) memory cell commonly used in CMOS SRAM devices (i.e., complimentary metal oxide silicon, static random access memory devices). As illustrated in FIG. 3, the SRAM memory cell 10 includes two N-channel field effect transistors (FETs) (e.g., T1 and T2) interconnected with two cross-coupled P-channel transistors (e.g., T3 and T4). A second pair of N-channel transistors (e.g., T5 and T6) have their gate terminals connected to the word-line and serve as select-transistors or "pass" gates to close the paths between the bit-lines BIT-LINE and BIT-LINE_BAR (where BIT-LINE_BAR indicates that an opposite, or complementary, logic state is asserted on the bit-line when setting the memory cell 10 to a particular logic state) and the memory transistors T1 and T2 of the cell.

Figure 4:
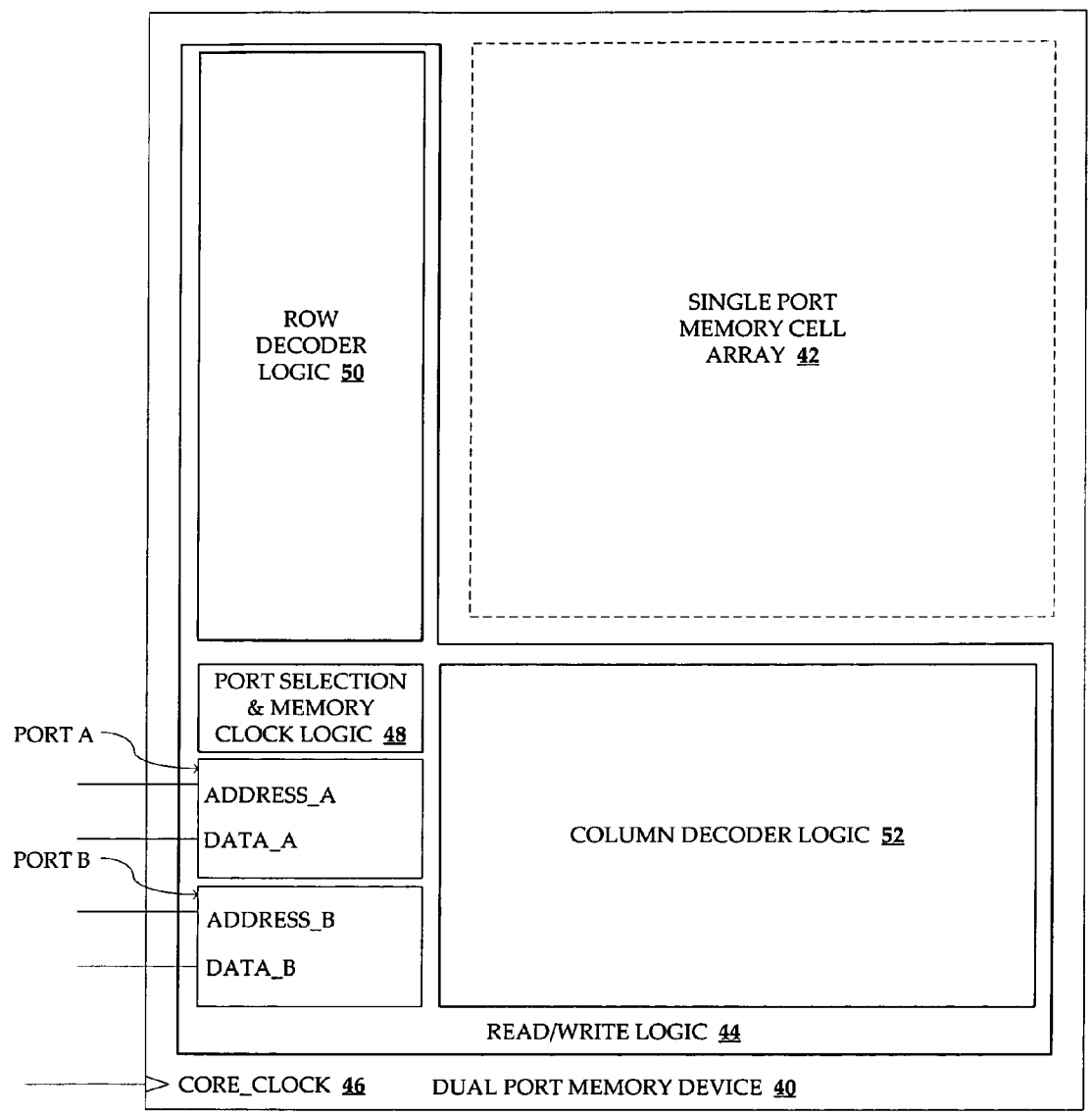
FIG. 4 illustrates a block diagram showing the logical components of a dual port memory device having an array of single port memory cells, consistent with one embodiment of the invention.

FIG. 4 illustrates a block diagram showing the logical components of a dual port memory device 40 having an array of single port memory cells 42, consistent with one embodiment of the invention. The dual port memory device 40 is primarily comprised of read/write logic 44 and the single-port memory cell array 42. For example, the single port memory cell array 42 may be an array of single port memory cells, such as the single-port memory cell 38 illustrated in FIG. 3. As will be described in further detail below, the dual port memory device 40 operates at the same frequency as the core clock signal 46.

In one embodiment of the invention, the read/write logic 44 includes two memory ports. For example, as illustrated in FIG. 4, the memory device 40 includes Port A and Port B. It will be appreciated by those skilled in the art that in other embodiments of the invention, the memory device may include more than two ports. In any case, each memory port receives the address of the particular memory location to be read from or written to during a single clock cycle of the core clock 46. Furthermore, if data is to be written to a memory location, the data to be written is received at the memory port. For example, if data is to be written to the memory location indicated by the address data received at ADDRESS_B of Port B, the data received at DATA_B is the data that will be written to the specified memory location.

In one embodiment of the invention, port selection and memory clock logic 48 assists in controlling the timing of the row decoder logic 50 and the column decoder logic 52. For example, the port selection and memory clock logic 48 may indicate to the row decoder logic 50 which address (e.g., ADDRESS_A or ADDRESS_B) to decode at a particular point in time relative to the core clock signal. Accordingly, based on a signal received from the port selection and memory clock logic 48, the row decoder logic 50 asserts one of the word-lines of the single-port memory cell array during a first portion of the core clock signal, and a second word-line during a second portion of the same core clock cycle. Similarly, the port selection and memory clock logic 48 may also determine which columns of memory cells the column decoder logic 52 decodes during different portions of a single core clock cycle. For example, in a memory operation to read from a first memory location and then write to a second memory location, the column decoder logic 52 may control the pre-charging of the bit-lines that determine the data written to the memory location during the write portion of the operation. Accordingly, it will be appreciated by those skilled in the art that the column decoder logic 52 may include pre-charging logic to pre-charge bit-lines during a write operation.

In one embodiment of the invention, the column decoder logic 52 includes one or more sense amplifiers for sensing voltage differentials on the complementary bit-lines of each memory cell connected to an asserted word-line. Accordingly, during a read operation, when a word-line is asserted, the sense amplifiers may sense the logic value of the memory cells connected to the particular word-line. Moreover, the sensed logic values may be routed to a data latch, which in turn latches the sensed data to be output.

Figure 5:
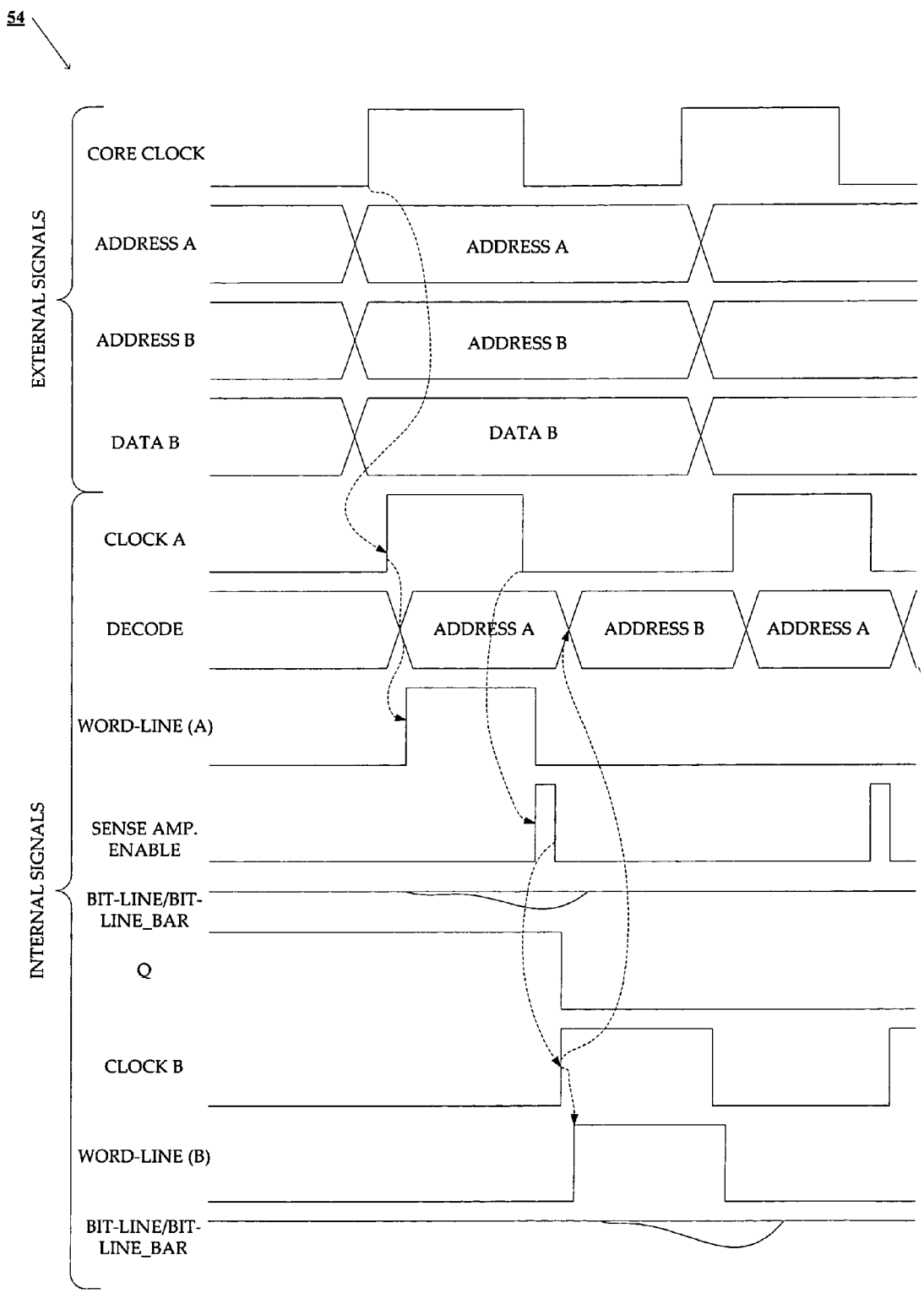
FIG. 5 illustrates a signal timing diagram for a dual port memory device according to one embodiment of the invention.

FIG. 5 illustrates a signal timing diagram 54 of a memory operation for a dual port memory device according to one embodiment of the invention. The particular memory operation illustrated in FIG. 5 involves a read operation, followed by a write operation. For example, the dual port memory operation involves reading data from a first memory location, followed by writing data to a second memory location. In FIG. 5, the data signals are grouped according to whether the signals are external or internal. For example, the external signals are those signals that are generated externally, and received by the memory device. Such signals include the CORE CLOCK, ADDRESS A, ADDRESS B, and DATA B signals. Similarly, the internal signals are those signals generated internally, within the memory device.

It can be seen from the timing diagram, that during one clock cycle of the core clock (i.e., CORE CLOCK), data signals indicating two memory locations are received at the memory device. For example, ADDRESS A and ADDRESS B, which indicate two memory locations, are asserted during a clock cycle of the core clock. Similarly, data to be written to the memory location indicated by the address received via ADDRESS B is received via DATA B.

In one embodiment of the invention, the rising edge of the core clock triggers a pulse, or rising edge, in the internally generated CLOCK A signal. While CLOCK A is high, the DECODE signal causes the memory location received via ADDRESS A to be decoded by the row and column decoder logic. Accordingly, the particular word-line corresponding to the address received at ADDRESS A is asserted. In FIG. 5, the assertion of the word-line is represented by the pulse shown in the WORDLINE (A) signal. The falling edge of the CLOCK A signal corresponds with the falling edge of the CORE CLOCK, and triggers the assertion of the SENSE AMP ENABLE signal. Accordingly, the sense amplifier of the memory device circuit senses any voltage differentials between the bit-lines of each memory cell connected to the previously asserted word-line. The logical values that are sensed by the sense amplified are then captured, or latched, via a data latch during the falling edge of the signal Q. This concludes the read portion of the memory operation.

The falling edge of the SENSE AMP ENABLE signal is followed by the rising edge of the CLOCK B signal, which is used in the write portion of the dual memory operation. Accordingly, the CLOCK B signal pulse causes the DECODE signal to be asserted, resulting in the decoding of the address indicated by data signals received at ADDRESS B. This also causes the assertion of the word-line corresponding to the address received at ADDRESS B. The bit-lines of the memory cells connected to the asserted word-line are pre-charged, and during the falling edge of the WORDLINE (B) signal, data is written to the memory cells connected to the particular word-line that was asserted.

It will be appreciated by those skilled in the art that FIG. 5 illustrates but one example of a timing diagram for a memory operation consistent with an embodiment of the present invention. In various alternative embodiments, the actual timing of signals may vary. Similarly, those skilled in the art will appreciate that the present invention is not limited to the particular memory operation shown in FIG. 5. In particular, a memory device consistent with an embodiment of the invention may perform a different combination of reads and writes during a single clock cycle, such as two read operations, or two write operations.

Figure 6:
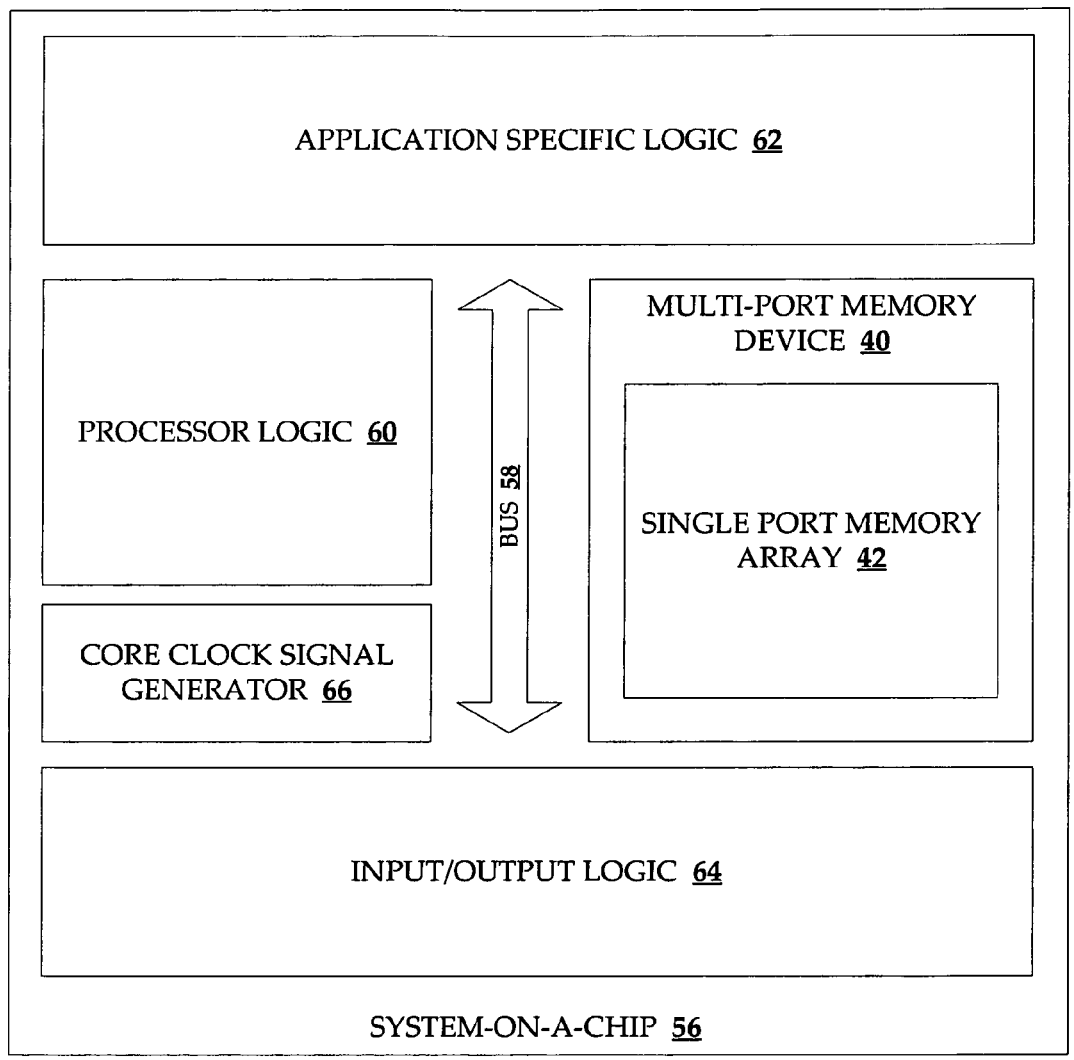
FIG. 6 illustrates a block diagram of a portion of a system-on-a-chip having a multi-port memory device, according to one embodiment of the invention.

FIG. 6 illustrates a block diagram of a portion of a system-on-a-chip (SoC) 56 having a multi-port memory device 40, according to one embodiment of the invention. The SoC 56 includes a multi-port memory device 40 with an array 42 of single port memory cells. The SoC 56 also includes a bus 58 (e.g., data bus, and/or address bus) that interconnects the multi-port memory device 40 with processor logic 60, application specific logic 62, and input/output logic 64. In a typical SoC, a non-volatile memory device (not shown) stores boot-up instructions that are executed by the processor logic 60 when the system is powered on. Depending on the particular system and application, the processor logic 60 of the SoC may execute software programs stored as a sequence of instructions in various memory devices. In addition, the application specific logic 62 may process data while the input/output logic may send and receive data to various other components (not shown).

In one embodiment of the invention, the SoC includes a core clock signal generator 66. Accordingly, each logical component of the SoC 56 may receive as an input a core clock signal, which cycles high and low at a predetermined frequency. Accordingly, the multi-port memory device 40 is capable of performing one read/write operation per port during one clock cycle of the core clock. Therefore, if the multi-port memory device is a dual-port memory device, two memory operations (e.g., one read and one write) may be executed in one clock cycle of the core clock.

Figure 7:
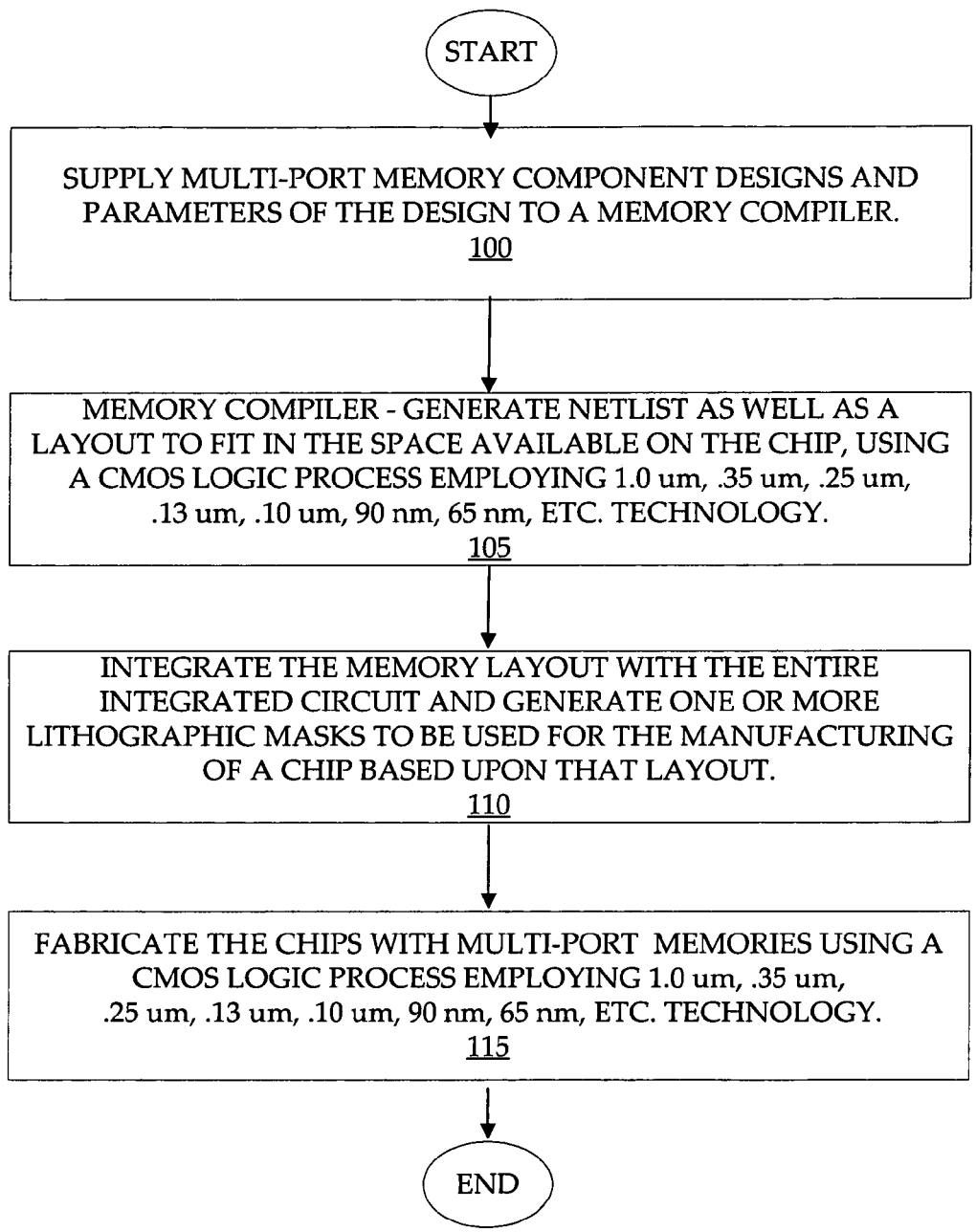
FIG. 7 illustrates an example of a process for generating a multi-port memory capable of performing multiple read/write operations in a single core clock cycle from designs of memory components utilizing a memory compiler consistent with one embodiment of the invention.

FIG. 7 illustrates an example of a process for generating a multi-port memory capable of performing multiple read/write operations in a single core clock cycle from designs of memory components utilizing a memory compiler consistent with one embodiment of the invention. In block 100, the designs for each memory component for the weak bit testing memory are supplied to the memory compiler, as well as other design parameters such as the number of columns and number of rows of the array, the available size on the chip and other parameters. Thus, the designs for a multi-port memory may be supplied to the memory compiler. A memory compiler may be a software program comprised of multiple algorithms and designs for the purpose of generating a circuit design and a layout in a space available on a target chip. The set of application-specific algorithms and interfaces of the memory compiler may be used by system integrated circuit (IC) integrators to rapidly create hundreds of silicon-proven memory cores. The memory compiler may receive the memory component designs and utilize those memory component designs in conjunction with memory circuit designs to optimize a circuit design and layout in the space available on a target chip.

In block 105, the memory compiler may generate a netlist and a layout targeted to fit in the space available on a target chip. Typically, the memory compiler will store the data representing the multi-port memory w on a machine-readable medium. The memory compiler may select the memory component building blocks so that they are sized appropriately for the targeted fabrication technology. The memory compiler then may provide the memory layout to be used to generate one or more lithographic masks utilized in the fabrication of the multi-port memory. The memory compiler may also provide a netlist for verification of the weak bit testing memory.

In block 110, the generated memory layout may be integrated with the rest of the layout for the chip and a machine may generate the lithographic masks that contain the information necessary for the fabrication of a functional device. The machine may generate one or more lithographic masks for transferring the circuit design onto the chip.

In block 115, a fabrication facility may fabricate one or more chips with the multi-port memories utilizing the lithographic masks generated from the memory compiler's circuit design and layout. Fabrication facilities may use a standard CMOS logic process having minimum line widths such as 1.0 um, 0.50 um, 0.35 um, 0.25 um, 0.18 um, 0.13 um, 0.10 um, 90 nm, 60 nm or less, to fabricate the chips. The size of the CMOS logic process employed typically defines the smallest minimum lithographic dimension that can be fabricated on the chip using the lithographic masks, which in turn, determines minimum component size. According to one embodiment, light may pass through these lithographic masks onto the chip to transfer the circuit design and layout for the multi-port memory onto the chip itself. In one embodiment, the memory design compiler is designed for embedded applications in a standard CMOS logic process.

In one embodiment, a memory compiler may be implemented in software as a set of instructions stored on a machine-readable medium. A machine-readable medium may include any mechanism that provides (e.g., stores and/or transmits) information in a form readable by a machine (e.g., a computer). For example, a machine-readable medium may include, but not be limited to: read only memory (ROM); random access memory (RAM); magnetic disk storage media; optical storage media; flash memory devices; DVD's; electrical, optical, acoustical or other forms of propagated signals (e.g., carrier waves, infrared signals, digital signals); EPROMs; EEPROMs; FLASH, magnetic or optical cards; or any other type of media suitable for storing electronic instructions. Instruction on a slower medium could be cached to a faster, more practical, medium.

In one embodiment, an example memory compiler may comprise the following: a graphic user interface, a common set of processing elements, and a library of files containing design elements such as circuits, control logic, and cell arrays that define the weak bit testing memory. In addition, one embodiment, a memory compiler may include object code in a set of executable software programs.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussions, it is appreciated that throughout the description, discussions utilizing terms such as "reading" or "writing" or "calculating" or "determining" or "displaying" or the like, refer to the action and processes of a computer system, electronic circuit, or similar electronic computing device, that manipulates and transforms data represented as physical (electronic) quantities within the computer system's registers and memories into other data similarly represented as physical quantities within the computer system memories or registers, or other such information storage, transmission or display devices.

Thus, a method is provided with reference to specific exemplary embodiments. It will be evident that various modifications and changes may be made to theses embodiments without departing from the broader spirit and scope of the invention. Accordingly, the specification and drawings are to be regarded in an illustrative rather than a restrictive sense.

We claim:

1. A random access memory device comprising:
   a plurality of memory cells arranged in a two-dimensional array, each memory cell connected to a single word-line and a pair of bit-lines;
   read/write logic to receive first and second memory addresses, and a core clock signal, the read/write logic to perform any combination of two read/write operations to the first and second memory addresses during a single cycle of the core clock signal received at the memory device, and the read/write logic to read/write data received at the memory device to the first and second memory locations during different portions of the single cycle of the core clock signal.

2. The random access memory device of claim 1, wherein the read/write logic, the two-dimensional array and internally generated memory clock control logic are integrated into one logical component.

3. The random access memory device of claim 1, wherein one read/write operation is performed during a first portion of the core clock signal cycle, and a second read/write operation is performed during a second portion of the core clock signal cycle.

4. The random access memory device of claim 1, further comprising:
   internal memory clock control logic to generate an internal clock signal, the internal clock signal derived from a core clock signal received from a core clock signal generator external to the memory device.

5. The memory device of claim 2, wherein each interface component accessing the memory device is clocked at the same frequency as the core clock signal.

6. A machine-readable medium storing data and instructions, which when executed by a machine, cause the machine to generate a representation of the random access memory device of claim 1.

7. The machine-readable medium of claim 6 storing a memory compiler to provide a design for one or more lithographic masks used in fabricating the random access memory device.

8. A method comprising:
   receiving, at a dual-port memory device, first and second memory addresses, each memory address corresponding to a row of single-port memory cells coupled to a common word-line in an array of single-port memory cells;
   during a first portion of a core clock cycle, reading or writing data from/to the first memory address; and
   during a second portion of the core clock cycle, reading or writing data from/to the second memory address.

9. The method of claim 8, wherein reading data from the first memory address comprises:
   decoding the first memory address and asserting a word-line corresponding to a memory location associated with the first memory address during a first portion of the core clock cycle.

10. The method of claim 9, wherein reading data from the first memory address comprises:

sensing a voltage differential between a pair of bit-lines coupled to each single port memory cell coupled to the asserted word-line; and for each bit cell coupled to the asserted word-line, latching a logical value in a data latch, the logical value based on the voltage differential sensed between the pair of bit-lines.

11. The method of claim 8, wherein writing data to the second memory address includes:

pre-charging a pair of bit-lines for each column of memory cells in the array of memory cells; and decoding the second memory address and asserting a word-line corresponding to a memory location associated with the second memory address during a second portion of the core clock cycle.

12. An apparatus comprising:

a core clock signal generator to generate a core clock signal that cycles high and low at a predetermined frequency;

at least one processor logic to process data; and a multi-port memory device having an array of single-port memory cells and N number of memory ports for receiving N number of memory address locations, the multi-port memory device capable of performing N number of any combination of read and/or write operations to the array of single port memory cells during a single clock cycle of the core clock signal, wherein the multi-port memory receives the core clock signal from the core clock signal generator, wherein the memory device performs the N number of any combination of read and/or write operations to the array of single port memory cells during a single clock cycle of the core clock signal by performing one operation during each 1/N portion of the core clock cycle.

13. The apparatus of claim 12, wherein the core clock signal is coupled to both the processor logic and the multi-port memory so that the processor logic and the multi-port memory device operate at the frequency of the core clock signal.

14. The apparatus of claim 12, wherein each memory address location corresponds to a row of single-port memory cells connected to a common word-line.

15. The apparatus of claim 12, wherein, during a write operation, a port is to receive a data signal indicating a data value to be written to the memory location in the array of single-port cells corresponding to the memory address received at the port.

16. The apparatus of claim 12, further comprising:

application specific logic to perform application specific processing of data; and input/output logic to send and receive data to one or more components external to the apparatus.

17. A machine-readable medium storing data and instructions, which when executed by a machine, cause the machine to generate a representation of the apparatus of claim 12.

18. The machine-readable medium of claim 17 storing a memory compiler to provide a design for one or more lithographic masks used in fabricating the apparatus.

* * * * *